(12) United States Patent
Knisley et al.

(10) Patent No.: US 12,084,464 B2
(45) Date of Patent: Sep. 10, 2024

(54) RHENIUM COMPLEXES AND METHODS OF USE

(71) Applicants: Applied Materials, Inc., Santa Clara, CA (US); Wayne State University, Detroit, MI (US)

(72) Inventors: Thomas Knisley, Livonia, MI (US); Keenan N. Woods, San Ramon, CA (US); Mark Saly, Santa Clara, CA (US); Charles H. Winter, Bloomfield Hills, MI (US); Stefan Cwik, Braintree, MA (US)

(73) Assignees: Applied Materials, Inc., Santa Clara, CA (US); Wayne State University, Detroit, MI (US)

( * ) Notice: Subject to any disclaimer, the term of this patent is extended or adjusted under 35 U.S.C. 154(b) by 0 days.

(21) Appl. No.: 17/100,292

(22) Filed: Nov. 20, 2020

(65) Prior Publication Data

US 2021/0155646 A1 May 27, 2021

Related U.S. Application Data

(60) Provisional application No. 62/939,321, filed on Nov. 22, 2019.

(51) Int. Cl.
*C07F 13/00* (2006.01)
*C23C 16/06* (2006.01)
*C23C 16/455* (2006.01)

(52) U.S. Cl.
CPC ............ *C07F 13/005* (2013.01); *C23C 16/06* (2013.01); *C23C 16/45553* (2013.01)

(58) Field of Classification Search
CPC ......... C07F 13/005; B01J 23/36; C01G 47/00
See application file for complete search history.

(56) References Cited

U.S. PATENT DOCUMENTS

| 5,155,247 | A | * | 10/1992 | Herrmann | ............... | C07C 45/28 |
| | | | | | | 556/46 |
| 5,342,985 | A | * | 8/1994 | Herrmann | ................. | C07C 6/04 |
| | | | | | | 570/135 |
| 6,090,956 | A | * | 7/2000 | Schulz | ................. | C07D 303/04 |
| | | | | | | 502/174 |
| 2001/0001798 | A1 | * | 5/2001 | Sharpless | ............. | C07D 301/14 |
| | | | | | | 546/255 |

FOREIGN PATENT DOCUMENTS

| DE | 54681 | * | 3/1967 |
| DE | 4203156 A1 | * | 8/1993 | ............. B01J 23/36 |

OTHER PUBLICATIONS

Schoop et al. Organometallics, 1993, 12, 571-574.*
Shcheglov, P. et al. Russian Chemical Bulletin, International Edition, vol. 54, No. 10, pp. 2247-2258, Oct. 2005.*
Romao et al. Chem Rev. 1997, 97, 3197-3246.*
Lo et al. J. Am. Chem. Soc. 2007, 129, 5, 1246-1253.*
Richardson dissertation, "The Use of Rhenium (VII) Oxide as a Catalyst for the Substitution of Hemiacetals", 2012, University of Nebraska, 1-33.*
Koth et al. Cheniker-Zeitung, 100, 1976, 290-291.*
English-Language Translation of D. Koth et al., 100 Chemiker-Zeitung, 290-291 (1976) (Year: 1976).*
CAS Abstract and Indexed Compounds D. Koth et al., 100 Chemiker-Zeitung, 290-291 (1976) (Year: 1976).*
CAS Abstract of M. Weidenbruch et al., 33B Zeitschrift fuer Naturforschung, Teil B: Anorganische Chemie, Organische Chemie, 1468-1471 (1978) (Year: 1978).*
CAS Abstract of E. Herdtweck et al., 45 Zeitschrift fuer Naturforschung, B: Chemical Sciences, 937-942 (1990) (Year: 1990).*
IUPAC. Compendium of Chemical Terminology, 2nd ed., p. 60 of 1622 "alkyl" (2012) (Year: 2012).*
M. Ecemis et al., 12 IEEE Transactions on Evolutionary Computation, 591-603 (2008) (Year: 2008).*
A. Jonsson et al., Essays in Biochemistry, 401-427 (2017) (Year: 2017).*
B. Hofmann et al., 885 Journal of Organometallic Chemistry, 32-38 (Feb. 5, 2019) (Year: 2019).*
S. Bellemin-Laponnaz et al., 5 Chemistry—A European Journal, 57-64 (1999) (Year: 1999).*
Danopoulos, Andreas A., et al., "t-Butylimido Compounds of Rhenium. X-Ray Crystal Structures of [(Bu'N), Re(p-NBu')]2, (BdN), ReCl,, (Bu'N), ReCl,C&I,, (Bu'N), Re(OSiMe,) and (Bu'N), ReCl*", Polyhedron vol. 8, No. 22, pp. 2657-2670, Jun. 7, 1989.
Edwards, Peter, et al., "Trioxorhenium(vii) Alkoxides, Di-isopropylarnides, Carboxylates and Related Compounds", J. Chem. Soc. Dalton Trans. 1984, pp. 2695-2702.
Hermann, Wolfgang A., et al., "Multiple bonds between transition metals and main-group elements: Part 161 Oxygen-donor adducts of organorhenium(VII) oxides: syntheses, structures and catalytic properties", Journal of Molecular Catalysis A: Chemical 118 (1997) pp. 33-45.
Herrmann, Wolfgang A., et al., "Mehrfachbindungen zwischen Hauptgruppenelementen und Ubergangsmetallen CLXVI. Molekulare Organorhenium-Vorstufen fur CVD-prozesse", Journal of Organometallic Chemistry 553 (1998), pp. 443-452.

(Continued)

*Primary Examiner* — Alexander R Pagano
(74) *Attorney, Agent, or Firm* — Servilla Whitney LLC

(57) ABSTRACT

Halide ligand free rhenium complexes are described as well as methods for depositing rhenium-containing films. Some embodiments provide a rhenium complex with a general formula of $O_3ReO\text{-}M\text{-}R1R2R3$, where M is a group IV element, R1 is selected from H, alkyl, alkenyl, alkynyl, an aromatic ring, or alkoxy, and R2 and R3 are each independently selected from H, alkyl, alkenyl, alkynyl, an aromatic ring, or alkoxy, or R2 and R3 join together to form a ring structure or an oxo group. Some embodiments provide a rhenium complex with a general formula of $Re(NR')_3$ (NHR"), where R' and R" are independently selected from H, alkyl, alkenyl, alkynyl, or an aromatic ring.

16 Claims, No Drawings

(56) References Cited

OTHER PUBLICATIONS

Herrmann, Wolfgang A., et al., "Multiple Bonds Between Main Group Elements and Transition Metals. 151.1 Trioxorhenium(VII) Alkoxide Complexes", Inorg. Chem. 1997, 36, 465-471, Nov. 22, 1995.

Herrmann, Wolfgang A., et al., "Multiple bonds between transition metals and main-group elements, 163 Nitrogen-donor adducts of organorhenium(VII) oxides: structural and catalytic aspects", Journal of Organometallic Chemistry 538 (1997), pp. 203-209.

Herrmann, Wolfgang A., et al., "Multiple Bonds between Transition Metals and Main-Group Elements. 145. Coordination Chemistry of Dirhenium Heptaoxide: Covalent Adducts and "Ionic Perrhenyl-Perrhenates"", Inorganic Chemistry, vol. 34, No. 19, Sep. 13, 1995, pp. 4701-4707.

Herrmann, Wolfgang A., et al., "Alkylrhenium oxides as homogeneous epoxidation catalysts: activity, selectivity, stability, deactivation", Journal of Molecular Catalysis, 86 (1994) pp. 243-266.

Nugent, William A., et al., "The First d/\0 Organoimido Complexes of Rhenium. X-Ray Crystal and Molecular Structure of (mu)-Oxo-(mu)-trimethylsilyloxo-(mu)-perrhenato-bi-s (di-t-butylimidotrimethylsilyloxorhenium)", J.C.S. Chem. Comm., 1979, 1105-1106.

Ringel, Von C., et al., "t-Butylperrhenat", Z. anorg. allg. Chem. 393, 65-73 (1972).

Roesky, Herbert W., et al., Uber die Funktion von Di(tert-butyl)silandiolat als Anker fur Metallfragmente in hohen und mittleren Oxidationsstufen. Synthese und Strukturen von (tBu)2SiO2(TeCl2-u-Cl2-TeCl2) und (tBu)2Si(OReO3)2.

Schmidbaur, H., et al., "185Re-und 187Re-NQR-Untersuchugen an Trimethylsilylund Trimethylgermanyl-perrhenat", Chem. Ber. 107, pp. 2697-1701 (1974).

Schmidbaur, Hubert, "Preparation and properties of some organometallic perrhenates", Chemiker-Zeitung, 100, Jahrgang (1976) Nr. 6.

Schmidt, Max, et al., "Trimethylsil ylperrhenat", Aus dem Institut fur Anorganische Chemie der Universitat Munchen, Eingegangen am Jul. 3, 1959, 4 pages.

Schmidt, M., et al., "Verbindungen mit Si—O—Se und Ge—O—Se-Gruppierungen", Eingegangen am 27, Feb. 1961, 1 page.

Sheldrick, G.M., et al., "Crystal and Molecular Structure of Trimethylsilyl Perrhenate, Me3SiOReO3", J. Chem. Soc. (A), 1969, 4 pages.

Veljanovski, Draganco, et al., "Heterogenisation of Acylperrhenate on Mesoporous Materials and its Application in Catalysis", Adv. Synth. Catal. 2006, 348, pp. 1752-1759.

* cited by examiner

RHENIUM COMPLEXES AND METHODS OF USE

CROSS-REFERENCE TO RELATED APPLICATIONS

This application claims priority to U.S. Provisional Application No. 62/939,321, filed Nov. 22, 2019, the entire disclosure of which is hereby incorporated by reference herein.

TECHNICAL FIELD

Embodiments of the present disclosure generally relate to rhenium complexes. More particularly, some embodiments of the disclosure relate to rhenium complexes which do not contain halogen ligands. Additionally, some embodiments of the disclosure relate to methods of using the disclosed rhenium complexes for depositing thin films.

BACKGROUND

The semiconductor industry continues to strive for continuous device miniaturization that is driven by the need for mobile, and high-performance systems in emerging industries such as autonomous vehicles, virtual reality, and future mobile devices. To accomplish this feat, new, high-performance materials are needed to circumvent inherent engineering and physics issues encountered in rapid reduction of features in microelectronic devices.

Rhenium (Re) is a new proposed material for integration owing to its low resistivity. Accordingly, rhenium and rhenium-based films are expected to have attractive material properties, specifically in conductor and barrier applications. Rhenium films have been proposed for applications from front end to back-end parts of semiconductor and microelectronic devices as well as other industries such as aerospace.

Thin-films of rhenium would ideally be deposited using thin-film deposition techniques such as Chemical Vapor Deposition (CVD) and Atomic Layer Deposition (ALD) owing to their inherent ability to deposit material in a high-throughput, conformal, and precise fashion.

Chemical vapor deposition (CVD) is one of the most common deposition processes employed for depositing layers on a substrate. CVD is a flux-dependent deposition technique that uses precise control of the substrate temperature and the precursors introduced into the processing chamber in order to produce a desired layer of uniform thickness. The reaction parameters become more critical as substrate size increases, creating a need for more complexity in chamber design and gas flow technique to maintain adequate uniformity.

One variant of CVD that demonstrates excellent step coverage is cyclical deposition or atomic layer deposition (ALD). ALD employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

There are few suitable rhenium-containing precursors that attain the requisite reactivity, thermal stability, and volatility to be suitable as a thin film deposition precursor. On top of that, all of the suitable rhenium-containing precursors contain halogens directly bonded to the metal atom which can lead to complications in advanced BEOL schemes as the halides can lead to processes that damage surrounding materials such as metals (e.g. tungsten, cobalt, copper, tantalum, etc.).

Further, the advancing complexity of advanced microelectronic devices is placing stringent demands on currently used deposition techniques. Unfortunately, there is a limited number of viable chemical precursors available that have the requisite properties of robust thermal stability, high reactivity, and vapor pressure suitable for film growth to occur.

In addition, precursors that often meet these properties still suffer from poor long-term stability and lead to thin films that contain elevated concentrations of contaminants such as oxygen, nitrogen, and/or carbon that may be deleterious to the target film application. Therefore, there is a need for improved thin film precursors for rhenium.

SUMMARY

One or more embodiments of the disclosure are directed to a rhenium complex having a general formula of $O_3ReO$-M-R1R2R3. M is a group IV element. R1 is selected from H, alkyl, aryl, and alkoxy. R2 and R3 are each independently selected from H, alkyl, aryl, and alkoxy, or R2 and R3 join together to form a ring structure, or R2 and R3 combine to be =O. When M is C, R1, R2 and R3 are not each H or $-CH_3$, when M is Si, R1, R2 and R3 are not each $-CH_3$ or $-C_2H_5$, when M is Ge, R1, R2 and R3 are not each $-CH_3$, $-C_2H_5$, or $-C_6H_5$; and when M is Sn, R1, R2 and R3 are not each $-CH_3$, $-C_2H_5$, or $-C_6H_5$.

Additional embodiments of the disclosure are directed to a rhenium complex having a general formula of $Re(NR')_3$(NR"R'"), wherein R', R" and R'" are independently selected from H, alkyl, and aryl, provided that when R'" is H, R' and R" are not t-butyl.

Further embodiments of the disclosure are directed to a method of depositing a rhenium-containing film comprising exposing a substrate to a halide ligand free rhenium precursor and a reactant at a deposition temperature.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

Embodiments of the disclosure provide rhenium complexes and methods for depositing rhenium-containing films. The methods of various embodiments utilize vapor deposition techniques, such as an atomic layer deposition (ALD) or chemical vapor deposition (CVD) to provide rhenium-containing films.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "complex", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed sequentially to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is not substantially exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time-delay. Next, a second reactive gas (i.e., a second precursor or compound B) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

Further, as mentioned previously, more than two reactive compounds may be used and the application of any reactive compound may be repeated during the cycle. For example, when three reactive compounds are used the cycle may consist of ABC, ABAC, ABCAB, ABCB. One skilled in the art will understand that other exposure sequences are also possible.

In an embodiment of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

The inventors have found the following process scheme for developing certain rhenium-imido complexes.

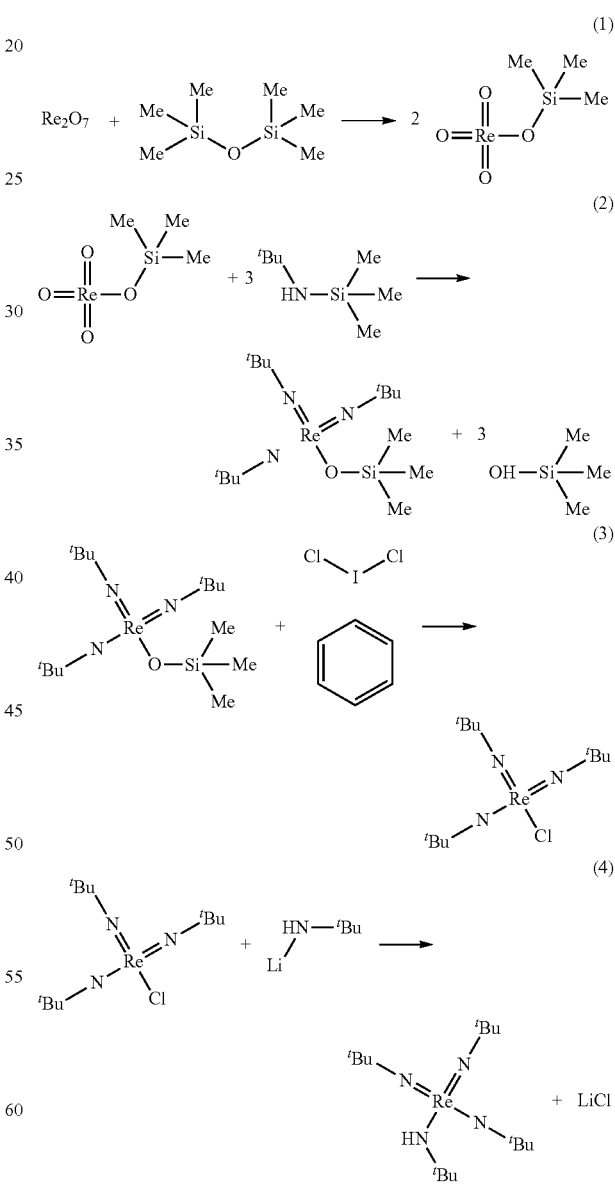

One or more embodiments of the disclosure are directed to a rhenium complex having a general formula of $O_3ReO$-$M$-$R1R2R3$, similar to product (1) above. Some embodiments of the disclosure are directed to a rhenium complex having a general formula of Re(NR')$_3$(O-M-R1R2R3), similar to product (2) above. Further embodiments of the disclosure are directed to a rhenium complex having a general formula Re(NR')$_3$X, similar to product (3) above. Other embodiments of the disclosure are directed to a rhenium complex having a general formula of Re(NR')$_3$(NR"R"), similar to product (4) above.

Some embodiments of this disclosure advantageously provide rhenium complexes with the requisite reactivity, thermal stability, and volatility to be suitable as a thin film deposition precursor. Further, some embodiments of the disclosure advantageously provide rhenium complexes without halide ligands. Accordingly, these complexes, when used to deposit rhenium-containing layers, produce less damage to surrounding substrate materials.

Some embodiments of the disclosure provide rhenium complexes having a general formula of O$_3$ReO-M-R1R2R3. The complexes may be generally drawn as follows:

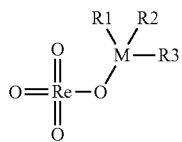

The atom M corresponds to a group IV element. As used in this regard, a "group IV" element is any element in the column starting with carbon and proceeding downward toward silicon on the periodic table. In some embodiments, the group IV element is carbon. In some embodiments, the group IV element is silicon. In some embodiments, the group IV element is germanium. In some embodiments, the group IV element is tin.

In some embodiments, the groups R1, R2, and R3 may each be independently selected from hydrogen (H), an alkyl group, an aryl group, and an alkoxy group. In other embodiments, R1 is selected from H, alkyl, alkenyl, alkynyl, an aromatic ring, or alkoxy and R2 and R3 join together to form a ring structure. In yet other embodiments, R1 is selected from H, alkyl, alkenyl, alkynyl, an aromatic ring, or alkoxy and R2 and R3 combine form an oxo group (=O).

In some embodiments, the alkyl group may contain from 1 to 6 carbon atoms. In some embodiments, the alkyl group may be linear. In some embodiments, the alkyl group may be branched. In some embodiments, the alkyl group may be selected from methyl, ethyl, n-propyl, isopropyl, cyclopropyl, n-butyl, sec-butyl, t-butyl, cyclobutyl, n-pentyl, neopentyl, cyclopentyl n-hexyl, and cyclohexyl.

In some embodiments, when M is carbon (C), R1, R2 and R3 are not each hydrogen (H) or methyl (—CH$_3$). In some embodiments, when M is silicon (Si), R1, R2 and R3 are not each methyl (—CH$_3$) or ethyl (—C$_2$H$_5$). In some embodiments, when M is germanium (Ge), R1, R2 and R3 are not each methyl (—CH$_3$), ethyl (—C$_2$H$_5$) or phenyl (—C$_6$H$_5$). In some embodiments, when M is tin (Sn), R1, R2 and R3 are not each methyl (—CHs), ethyl (—C$_2$H$_5$) or phenyl (—C$_6$H$_5$).

Stated differently, in some embodiments, the rhenium complex is not one or more of the following:

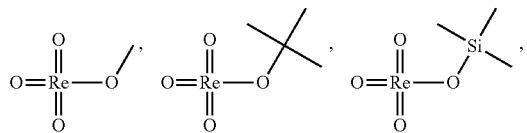

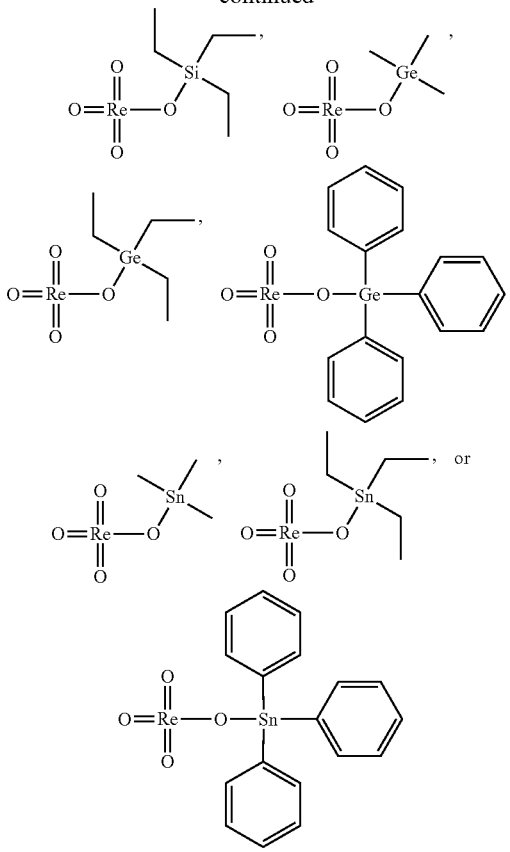

Without being bound by theory, it is believed that one or more of the above compounds may be known in the prior art. While the above compounds may be known, the use of these compounds, as well as others of the broader genus, for the deposition of rhenium is not known within the art.

In some embodiments, the alkenyl group is vinyl. In some embodiments, the alkynyl group is allyl.

In some embodiments, the aromatic ring is a phenyl group. In some embodiments, the aromatic ring comprises at least one heteroatom. In some embodiments, the aromatic ring is pyrolyl, imidazolyl, pyrazolyl, furanyl, oxazolyl or isoxazolyl.

In some embodiments, the alkoxy group comprises an alkyl, alkenyl, or alkynyl group or an aromatic ring, as described above, bonded to an oxygen atom. For example, In some embodiments, the alkoxy group is methoxy, ethoxy, or phenoxy.

In some embodiments, the alkyl, alkenyl or alkynyl group may contain one or more heteroatom. In some embodiments, the alkoxy group may contain an additional heteroatom. In some embodiments, the heteroatom is oxygen. In some embodiments, the heteroatom is nitrogen. In some embodiments, the heteroatom is the terminal atom of the group (excluding hydrogens). Stated differently, in these embodiments, an alkyl group may be an amine or an alcohol. In some embodiments, the heteroatom is within the group. Stated differently, in these embodiments, an alkyl group may be a secondary amine, a tertiary amine or an ether.

In some embodiments, the alkyl, alkenyl, alkynyl, aromatic ring or alkoxy group may be substituted with one or more halogen atoms. In this regard, the rhenium precursors are still understood to be "halide ligand free" as they contain no halogen atoms closely bonded to the rhenium atom (e.g., a halide ligand or oxohalide ligand).

In some embodiments, R2 and R3 join together to form a ring structure. The complexes may generally be drawn as follows:

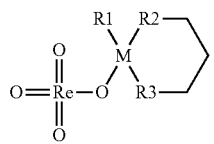

In some embodiments, the ring structure may contain 3, 4, 5, 6 or more atoms. In some embodiments, the ring structure may contain heteroatoms. In some embodiments, the heteroatom is oxygen. In some embodiments, the heteroatom is nitrogen. In some embodiments, the ring structure may contain double bonds. In some embodiments, the ring structure is aromatic.

In some embodiments, the ring structure comprises cyclopropyl, cyclobutyl, cyclopentyl, cyclohexyl, phenyl, furan, tetrahydrofuran, pyran, tetrahydropyran, pyrrolidine, pyrrole, pyridine or piperidine.

In some embodiments, R2 and R3 combine form an oxo group (=O). These complexes may generally be drawn as follows:

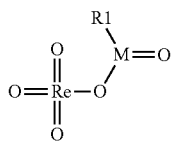

In some embodiments, R1 contains fluorine. Even with fluorine contained within R1, the complex is a halide ligand free rhenium complex as there are no halide ligands (e.g., halogen or oxohalogen) bonded to the rhenium center.

Some embodiments of the disclosure are directed to a rhenium complex having a general formula of Re(NR')₃(O-M-R1R2R3). The complexes may be generally drawn as follows.

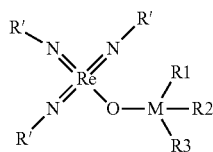

The potential identities of M are discussed above. The potential identities of R1, R2 and R3 are discussed above. The potential identities of R' are discussed below. In some embodiments, when M is silicon, R' is not t-butyl and R1, R2 and R3 are not methyl.

Further embodiments of the disclosure are directed to a rhenium complex having a general formula Re(NR')₃X. The complexes may be generally drawn as follows.

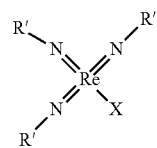

The potential identities of R' are discussed below. X is an anionic ligand. In some embodiments, X is an alkyl, alkoxy, halide, or —CN group. In some embodiments, X is selected from F, Cl, Br or I. In some embodiments, X is not F. In some embodiments, X is Cl. In some embodiments, when R' is t-butyl, X is not Cl.

Additional embodiments of the disclosure provide rhenium complexes having a general formula of Re(NR')₃(NR"R'''). The complexes may be generally drawn as follows:

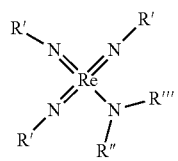

In some embodiments, R', R" and R'" are independently selected from H, alkyl, alkenyl, alkynyl and aromatic rings (as described above). In some embodiments, R' is not H. In some embodiments, R' and R" do not contain any heteroatoms. In some embodiments, R' and R" are identical. In some embodiments, R" and R'" are identical. In some embodiments, when R'" is H, R' and R" are not t-butyl. Stated differently, in some embodiments, the rhenium complex is not Re(N$^t$Bu)₃(NH$^t$Bu), illustrated as:

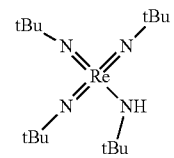

Further embodiments of the disclosure provide methods for depositing rhenium-containing films. The method comprises exposing a substrate to a halide ligand free rhenium precursor and a reactant at a deposition temperature. In some embodiments, the halide ligand free rhenium precursor comprises a rhenium complex of the general formula O₃ReO-M-R1R2R3 described above. In some embodiments, the halide ligand free rhenium precursor comprises O₃ReOSi(CH₃)₃. In some embodiments, the halide ligand free rhenium precursor comprises a rhenium complex of the general formula Re(NR')₃(NHR") described above. In some embodiments, the halide ligand free rhenium precursor is stable at the deposition temperature.

The complexes react as precursors in an ALD or CVD process to form rhenium-containing films. In some embodiments, the films comprise pure rhenium films, rhenium nitrides, rhenium oxides, rhenium carbides, rhenium silicides, rhenium borides or combinations thereof. In some embodiments, the complexes are reacted with other metal-containing precursors to form alloyed films. In some embodiments, the alloyed films are binary films or ternary films (e.g., ReCuZn). In some embodiments, the films may include rhenium bimetallic oxides (e.g., ReAlO$_x$, ReTiO$_x$), nitrides, carbides, silicides, borides or combinations thereof. Suitable reactants include, but are not limited to, H$_2$, NH$_3$, hydrazine, hydrazine derivatives, amines, alcohols, siloxanes, silanes, substituted silanes, boranes, metal alkyls (e.g., trimethyl aluminum, diethyl zinc), metal hydrides, O$_2$, O$_3$, and/or water. Plasma treatments of a co-reactant or as a post-treatment may also be used.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A rhenium complex having a general formula of O$_3$ReO-M-R1R2R3, wherein:
   M is a group IV element selected from silicon, germanium, and tin;
   when M is Si then R1 is selected from the group consisting of H, alkyl, and alkoxy, and R2 and R3 are each independently selected from the group consisting of H, alkyl, and alkoxy, or R2 and R3 join together to form a ring structure, or R2 and R3 combine to form an oxo group, and each alkyl is independently selected from the group consisting of methyl, ethyl, n-propyl, isopropyl, cyclopropyl, n-butyl, sec-butyl, cyclobutyl, n-pentyl, neopentyl, cyclopentyl n-hexyl, and cyclohexyl, provided that R1, R2 and R3 are not each —CH$_3$ or —C$_2$H$_5$;
   when M is Ge then R1 is selected from the group consisting of H, alkyl, and alkoxy, and R2 and R3 are each independently selected from the group consisting of H, alkyl, and alkoxy, or R2 and R3 join together to form a ring structure, or R2 and R3 combine to form an oxo group, provided that R1, R2 and R3 are not each —CH$_3$ or —C$_2$H$_5$; and
   when M is Sn then R1 is selected from the group consisting of H, alkyl, alkoxy, and aryl, and R2 and R3 are each independently selected from the group consisting of H, alkyl, alkoxy, and aryl, or R2 and R3 join together to form a ring structure, or R2 and R3 combine to form an oxo group, and each alkyl is independently selected from the group consisting of methyl, ethyl, n-propyl, isopropyl, cyclopropyl, n-pentyl, neopentyl, cyclopentyl n-hexyl, and cyclohexyl, provided that R1, R2 and R3 are not each CH$_3$, —C$_2$H$_5$, or —C$_6$H$_5$.

2. The rhenium complex of claim 1, wherein the group IV element is silicon.

3. The rhenium complex of claim 1, wherein the group IV element is germanium.

4. The rhenium complex of claim 1, wherein the group IV element is tin.

5. The rhenium complex of claim 1, wherein R1, R2 and R3 are each independently selected from the group consisting of H, alkyl, aryl, or alkoxy.

6. The rhenium complex of claim 1, wherein R2 and R3 join together to form a ring structure.

7. The rhenium complex of claim 6, wherein the ring structure contains a heteroatom.

8. The rhenium complex of claim 6, wherein the ring structure contains at least one double bond.

9. The rhenium complex of claim 6, wherein the ring structure is aromatic.

10. The rhenium complex of claim 1, wherein M is Sn, R1 is alkyl or aryl and R2 and R3 combine to form the oxo group.

11. A method of depositing a rhenium-containing film comprising exposing a substrate to a rhenium complex of claim 1.

12. A rhenium complex having a general formula of O$_3$ReO—C—R1R2R3, wherein:
   R1 is selected from H, and aryl; and
   R2 and R3 are each independently selected from H, and aryl, or R2 and R3 join together to form a ring structure, provided that R1, R2 and R3 are not each H, that the ring structure does not contain oxygen.

13. The rhenium complex of claim 12, wherein R2 and R3 join together to form a ring structure.

14. The rhenium complex of claim 13, wherein the ring structure contains a double bond.

15. The rhenium complex of claim 13, wherein the ring structure is aromatic.

16. The rhenium complex of claim 13, wherein the ring structure does not contain heteroatoms.

* * * * *

UNITED STATES PATENT AND TRADEMARK OFFICE
CERTIFICATE OF CORRECTION

| | | |
|---|---|---|
| PATENT NO. | : 12,084,464 B2 | Page 1 of 1 |
| APPLICATION NO. | : 17/100292 | |
| DATED | : September 10, 2024 | |
| INVENTOR(S) | : Thomas Knisley et al. | |

It is certified that error appears in the above-identified patent and that said Letters Patent is hereby corrected as shown below:

In the Specification

Column 2, Line 33, replace "R''" after "wherein R', R" and" and before "are independently selected" with "R'''".

Column 5, Line 7, replace "(NR"R")" after "formula of Re(Nr')$_3$" with "(NR"R''')".

Column 5, Line 56, replace "(-CH$_5$)" after "each methyl" and before ", ethyl (-C$_2$H$_5$)" with "(-CH$_3$)".

Signed and Sealed this
Twelfth Day of November, 2024

*Katherine Kelly Vidal*

Katherine Kelly Vidal
*Director of the United States Patent and Trademark Office*